(12) United States Patent
Lee et al.

(10) Patent No.: US 10,707,232 B2
(45) Date of Patent: Jul. 7, 2020

(54) METHOD FOR FABRICATING SEMICONDUCTOR DEVICE USING A POROSITY IN A SACRIFICIAL PATTERN, AND FABRICATING EQUIPMENT FOR SEMICONDUCTOR DEVICE USING THE SAME

(71) Applicant: SAMSUNG ELECTRONICS CO., LTD., Suwon-si, Gyeonggi-Do (KR)

(72) Inventors: Gyeong Hee Lee, Hwaseong-si (KR); Jun Yeong Lee, Bucheon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/216,451

(22) Filed: Dec. 11, 2018

(65) Prior Publication Data

US 2019/0348432 A1    Nov. 14, 2019

(30) Foreign Application Priority Data

May 14, 2018  (KR) .......................... 10-2018-0054797
Jun. 15, 2018  (KR) .......................... 10-2018-0068769

(51) Int. Cl.
*H01L 21/77*       (2017.01)
*H01L 27/11582*  (2017.01)
(Continued)

(52) U.S. Cl.
CPC ...... *H01L 27/11582* (2013.01); *B05C 5/0208* (2013.01); *H01L 21/02118* (2013.01);
(Continued)

(58) Field of Classification Search
CPC ......... H01L 21/02118; H01L 21/02282; H01L 21/31058; H01L 21/77; H01L 21/8229; H01L 21/823431; H01L 21/8239
See application file for complete search history.

(56) References Cited

U.S. PATENT DOCUMENTS

| | | |
|---|---|---|
| 3,989,168 A | 7/1976 | Kuhn |
| 6,379,744 B1 | 4/2002 | Gouranlou et al. |

(Continued)

FOREIGN PATENT DOCUMENTS

| | | |
|---|---|---|
| JP | 2006-277803 | 10/2006 |
| KR | 10-2001-0003577 | 1/2001 |
| KR | 10-2017-0022470 | 3/2017 |

*Primary Examiner* — Hoai V Pham
(74) *Attorney, Agent, or Firm* — F. Chau & Associates, LLC

(57) ABSTRACT

A method for fabricating a semiconductor device, including forming a lower structure on a substrate. The lower structure includes a first sacrificial layer and a first insulating layer alternately and repeatedly stacked. A first hole is formed in the lower substrate. The first hole exposes an upper surface of the substrate. A sacrificial pattern is formed in the first hole. A porosity of the sacrificial pattern increases toward the substrate. An upper structure is formed on the lower structure and the sacrificial pattern. The upper structure includes a second sacrificial layer and a second insulating layer alternately and repeatedly stacked. A second hole is formed in the upper structure. The second hole exposes the sacrificial pattern. The sacrificial pattern is removed.

10 Claims, 19 Drawing Sheets

(51) Int. Cl.
*H01L 27/1157* (2017.01)
*H01L 21/02* (2006.01)
*B05C 5/02* (2006.01)
*H01L 21/311* (2006.01)
*H01L 21/3213* (2006.01)
*H01L 21/3105* (2006.01)
*H01L 21/28* (2006.01)

(52) U.S. Cl.
CPC .. *H01L 21/02282* (2013.01); *H01L 21/31058* (2013.01); *H01L 21/31111* (2013.01); *H01L 21/32133* (2013.01); *H01L 27/1157* (2013.01); *H01L 29/40117* (2019.08)

(56) References Cited

U.S. PATENT DOCUMENTS

| | | |
|---|---|---|
| 8,440,531 B2 | 5/2013 | Han et al. |
| 8,946,023 B2 | 2/2015 | Makala et al. |
| 9,449,982 B2 | 9/2016 | Lu et al. |
| 2015/0151311 A1 | 6/2015 | Jung et al. |
| 2017/0162430 A1* | 6/2017 | Dai .................. H01L 21/76811 |
| 2017/0221704 A1 | 8/2017 | Mohanty et al. |

* cited by examiner

METHOD FOR FABRICATING SEMICONDUCTOR DEVICE USING A POROSITY IN A SACRIFICIAL PATTERN, AND FABRICATING EQUIPMENT FOR SEMICONDUCTOR DEVICE USING THE SAME

The present application claims priority to Korean Patent Application No. 10-2018-0054797, filed in the Korean Intellectual Property Office on May 14, 2018, and Korean Patent Application No. 10-2018-0068769, filed in the Korean Intellectual Property Office on Jun. 15, 2018, the disclosure of which is herein incorporated by reference in its entirety.

TECHNICAL FIELD

The present disclosure relates to semiconductor device fabrication and, more specifically, to a method for fabricating a semiconductor device and fabricating equipment of the semiconductor device using the same.

DISCUSSION OF THE RELATED ART

A semiconductor memory device is a memory storage device that is implemented using semiconductors such as silicon (Si), germanium (Ge), gallium arsenide (GaAs) and/or indium phosphide (InP). The semiconductor memory device may be roughly classified into a volatile memory device and a non-volatile memory device. The volatile memory device is a memory device that does not retain stored data in the absence of power. The non-volatile memory device is a memory device that is capable of retaining stored data even in the absence of power. Examples of nonvolatile memory devices include flash memory, ROM (Read Only Memory), PROM (Programmable ROM), EPROM (Electrically Programmable ROM), EEPROM (Electrically Erasable and Programmable ROM), resistive memory (e.g., a PRAM (phase-change RAM), FRAM (Ferroelectric RAM), and RRAM (Resistive RAM)), and the like.

Modern non-volatile memory devices are highly integrated and are therefore able to store a large amount of data within a small form factor.

In the case of a two-dimensional or planar memory device, the degree of integration is determined by an area occupied by the unit memory cells. Three-dimensional memory devices have also been implemented. In three-dimensional memory devices, unit memory cells are vertically arranged.

SUMMARY

A method for fabricating a semiconductor device, including forming a lower structure on a substrate. The lower structure includes a first sacrificial layer and a first insulating layer alternately and repeatedly stacked. A first hole is formed in the lower structure. The first hole exposes an upper surface of the substrate. A sacrificial pattern is formed in the first hole. A porosity of the sacrificial pattern increases toward the substrate. An upper structure is formed on the lower structure and the sacrificial pattern. The upper structure includes a second sacrificial layer and a second insulating layer alternatively and repeatedly stacked. A second hole is formed in the upper structure. The second hole exposes the sacrificial pattern. The sacrificial pattern is removed.

A method for fabricating a semiconductor device includes providing a lower structure including a first hole. A first material pattern is formed at least partially filling a first part of the first hole. The first material pattern has a first porosity. A second material pattern is formed on the first material pattern. The second material pattern fills a second part of the first hole. The second material pattern has a second porosity that is less porous than the first porosity. An upper structure is formed on the lower structure and the second material pattern. A second hole is formed at least partially overlapping the first hole in the upper structure. The first material pattern and the second material pattern are removed.

A method for fabricating a semiconductor device includes providing a lower structure including a first hole. A sacrificial pattern is formed including a first material pattern partially filling a first part of the first hole so as to leave a void under the first material pattern. An upper structure is formed on both the lower structure and the first material pattern. A second hole is formed exposing the sacrificial pattern in the upper structure. The sacrificial pattern is removed.

Equipment for fabricating a semiconductor device includes a rotatable wafer support configured to receive a wafer. A sacrificial material applier is configured to provide a sacrificial material onto the wafer. A temperature adjuster is configured to adjust a temperature of the wafer. The sacrificial material applier is configured to provide the sacrificial material of a first concentration on the wafer, and then provide the sacrificial material of a second concentration, greater than the first concentration, on the wafer. The temperature adjuster is configured to maintain the wafer at a first temperature when the sacrificial material of the first concentration is provided. The temperature adjuster is configured to maintain the wafer at a second temperature lower than the first temperature when the sacrificial material of the second concentration is provided.

Equipment for fabricating a semiconductor device includes a wafer carrier unit configured to provides a lower structure in which a first sacrificial layer and a first insulating layer are alternately and repeatedly stacked on a substrate. The lower structure includes a first hole disposed therein. A sacrificial material applying unit is configured to provide a sacrificial material for forming a sacrificial pattern in the first hole on the wafer. A temperature adjusting unit is configured to maintain a temperature of the wafer. The wafer carrier unit, the sacrificial material applying unit, and/or the temperature adjusting unit is configured to adjust a porosity of the sacrificial pattern so that the porosity of the sacrificial pattern becomes more porous toward the substrate.

BRIEF DESCRIPTION OF THE DRAWINGS

The above and other aspects and features of the present inventive concept will become more apparent by describing in detail exemplary embodiments thereof with reference to the attached drawings, in which.

Equipment for fabricating a semiconductor device includes a wafer carrier unit configured to provides a lower structure in which a first sacrificial layer and a first insulating layer are alternately and repeatedly stacked on a substrate. The lower structure includes a first hole disposed therein. A sacrificial material applying unit is configured to provide a sacrificial material for forming a sacrificial pattern in the first hole on the wafer. A temperature adjusting unit is configured to maintain a temperature of the wafer. The wafer carrier unit, the sacrificial material applying unit, and/or the temperature adjusting unit is configured to adjust a porosity of the sacrificial pattern so that the porosity of the sacrificial pattern becomes more porous toward the substrate.

DETAILED DESCRIPTION OF THE EMBODIMENTS

Hereinafter, a method for fabricating a semiconductor device, according to exemplary embodiments of the present inventive concept, will be described with reference to FIGS. 1 to 13.

Hereinafter, the present inventive concept will be described by taking a method for fabricating a semiconductor device in which unit memory cells are vertically arranged as an example. However, the present inventive concept may be variously applied to methods for fabricating a semiconductor device and forming holes having a high aspect ratio.

Figure 1:
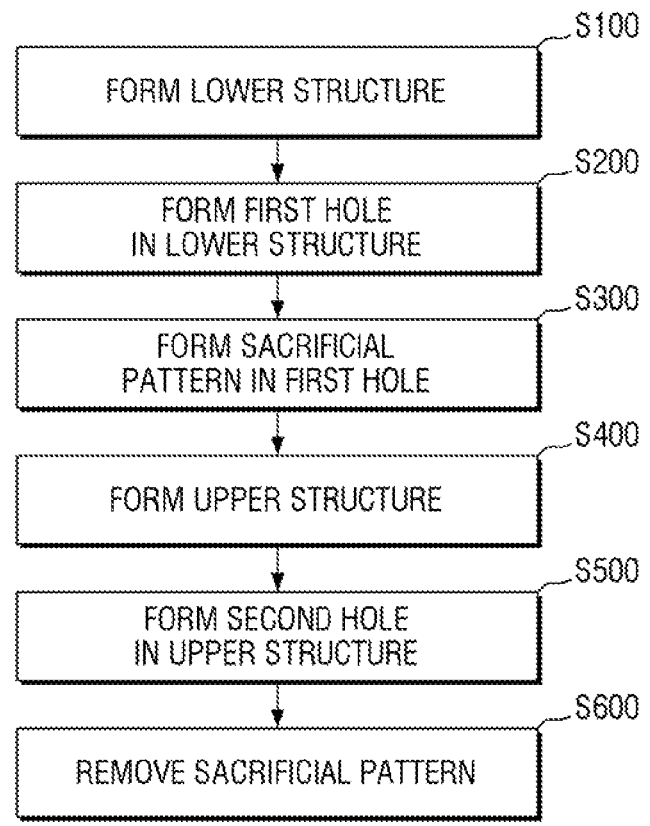
FIG. 1 is a flowchart illustrating a method for fabricating a semiconductor device according to exemplary embodiments of the present inventive concept.

FIG. 1 is a flowchart illustrating a method for fabricating a semiconductor device according to exemplary embodiments of the present inventive concept. FIGS. 2 to 13 are diagrams illustrating intermediate steps in a method for fabricating a semiconductor device, according to exemplary embodiments of the present inventive concept.

Figure 2:
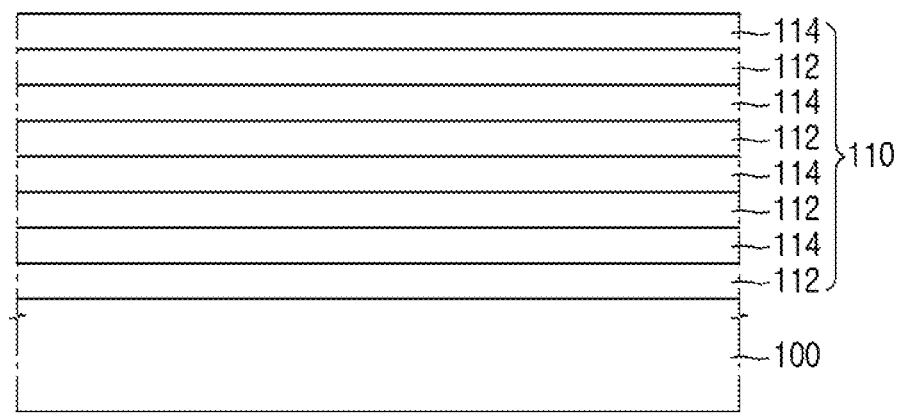
FIGS. 2 to 13 are diagrams illustrating intermediate steps in a method for fabricating a semiconductor device according to exemplary embodiments of the present inventive concept.

Referring to FIGS. 1 and 2, a lower structure 110 is formed on a substrate 100 (S100).

The substrate 100 may be, for example, bulk silicon or silicon-on-insulator (SOI). Alternatively, the substrate 100 may be a silicon substrate or may include other material, for example, silicon germanium, indium antimonide, lead tellurium compound, indium arsenide, indium phosphide, gallium arsenide and/or gallium antimonide. The substrate 100 may include an epitaxial layer formed on a base substrate.

The lower structure 110 may include a first sacrificial layer 112 and a first insulating layer 114 that are alternately stacked on the substrate 100. In FIG. 2, the plurality of first sacrificial layers 112 and the plurality of first insulating layers 114 are formed to have the same thickness each other, but the present disclosure is not limited thereto. For example, a thickness of the first sacrificial layer 112 may be different from a thickness of the first insulating layer 114. According to exemplary embodiments of the present inventive concept, the first sacrificial layer 112 of the lowest part (e.g. closest to the substrate 100) may be thicker than the other first sacrificial layers 112 and/or the first insulating layers 114.

The first sacrificial layer 112 may have an etching selectivity with respect to the first insulating layer 114. As used herein, the phrase "etching selectivity" is understood to mean that two or more substances have different etch rates under similar conditions or that under certain conditions, one substance is etched while the other substance remains substantially un-etched. For example, in the case where the first insulating layer 114 contains silicon oxide, the first sacrificial layer 112 may include silicon, silicon nitride, silicon oxynitride, and/or silicon carbide. However, the present disclosure is not limited thereto, and the first sacrificial layer 112 may include various materials having an etching selectivity with respect to the first insulating layer 114.

Figure 3:
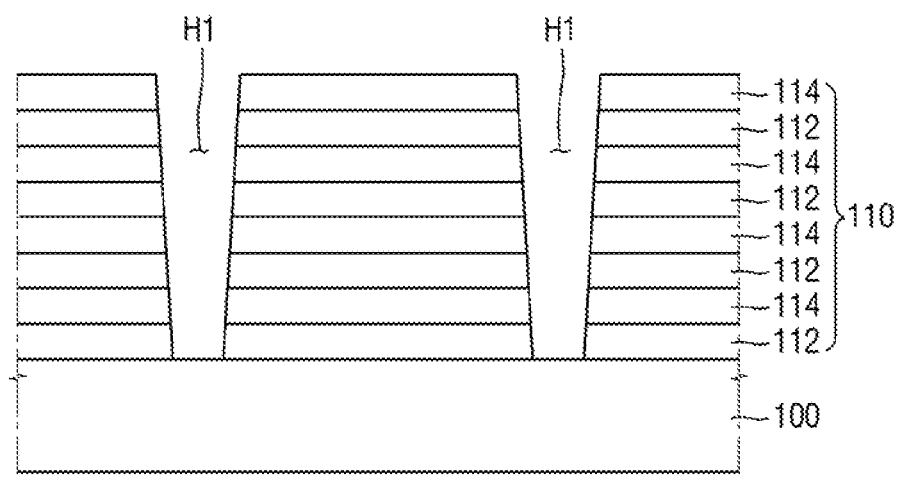

Referring to FIGS. 1 and 3, a first hole H1 is formed in the lower structure 110 (S200). Therefore, the lower structure 110 including the first hole H1 may be provided.

For example, a part of the lower structure 110 may be etched to form a first hole H1 penetrating the first sacrificial layer 112 and the first insulating layer 114. The first hole H1 may expose a part of the upper surface of the substrate 100. In FIG. 3, the first hole H1 is illustrated as being formed until the upper surface of the substrate 100 is exposed, but the present disclosure is not limited thereto. For example, formation of the first hole H1 may include etching of a part of the upper part of the substrate 100.

According to exemplary embodiments of the present inventive concept, the first hole H1 may have a tapered shape. For example, as illustrated, a width of the first hole H1 may become narrower toward the substrate 100. The precise shape of these first hole H1 may be influenced by the characteristics of the etching process for forming the first hole H1, but the present invention is not limited to this particular shape.

Figure 4:
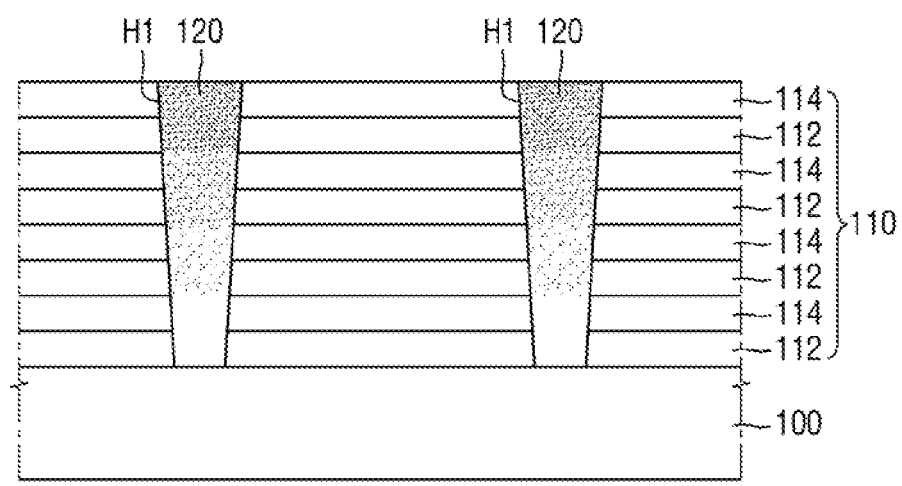

Referring to FIGS. 1 and 4, the sacrificial pattern 120 is formed in the first hole H1 (S300).

The sacrificial pattern 120 may at least partially fill the first hole H1. The sacrificial pattern 120 may support the shape of the first hole H1 when the upper structure (130 of FIG. 5) is formed on the lower structure 110, as is discussed in greater detail below.

The sacrificial pattern 120 may be formed such that its porosity increases toward the substrate 100. For example, the lower part of the sacrificial pattern 120 closest to the substrate 100 may be more porous than the upper part of the sacrificial pattern 120 farthest from the substrate 100. According to exemplary embodiments of the present inventive concept, the sacrificial pattern 120 may also include a void at the lower part. For example, the sacrificial pattern 120 may be absent from a region of the first hole H1 that is closest to the substrate 100. Formation of the sacrificial pattern 120 will be described in greater detail below with reference to FIGS. 14 to 24.

The sacrificial pattern 120 may include a material having an etching selectivity with respect to the first sacrificial layer 112 and the first insulating layer 114. For example, the sacrificial pattern 120 may include, but is not limited to including, polysilicon, silicon oxide, silicon nitride, silicon carbide, and/or tungsten. Hereinafter, the sacrificial pattern 120 will be described as containing polysilicon.

Figure 5:
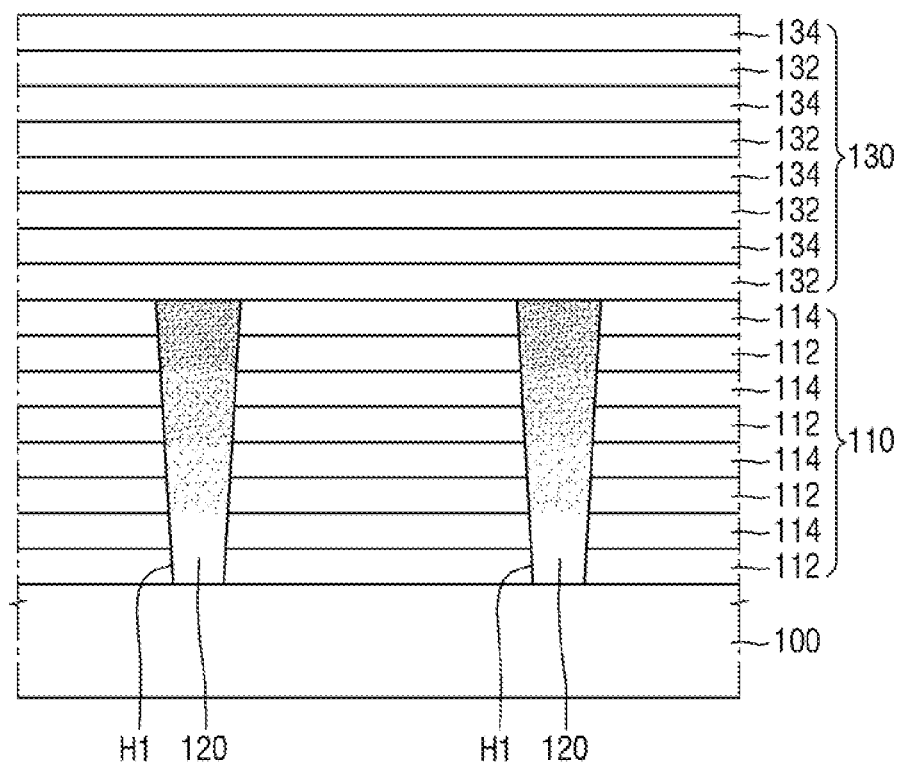

Referring to FIGS. 1 and 5, the upper structure 130 is formed on the lower structure 110 and the sacrificial pattern 120, with the lower structure 110 being disposed between the upper structure 130 and the substrate 100 (S400).

The upper structure 130 may include a second sacrificial layer 132 and a second insulating layer 134 alternately stacked on the substrate 100. In FIG. 5, the plurality of second sacrificial layers 132 and the plurality of second insulating layers 134 are illustrated as being formed with the same thickness as each other, but the present disclosure is not limited thereto. For example, the thickness of the second sacrificial layer 132 may be different from the thickness of the second insulating layer 134. According to exemplary embodiments of the present inventive concept, the second sacrificial layer 132 of the uppermost part may also be thicker than the other second sacrificial layers 132 and/or the second insulating layers 134.

The second sacrificial layer 132 may have an etching selectivity with respect to the second insulating layer 134. For example, when the second insulating layer 134 contains silicon oxide, the second sacrificial layer 132 may include silicon, silicon nitride, silicon oxynitride, and/or silicon carbide. However, the present disclosure is not limited thereto, and the second sacrificial layer 132 may contain various materials having an etching selectivity with respect to the second insulating layer 134.

According to exemplary embodiments of the present inventive concept, the second sacrificial layer 132 may include substantially the same material as the first sacrificial layer 112. According to exemplary embodiments of the present inventive concept, the second insulating layer 134 may include substantially the same material as the first insulating layer 114.

Figure 6:
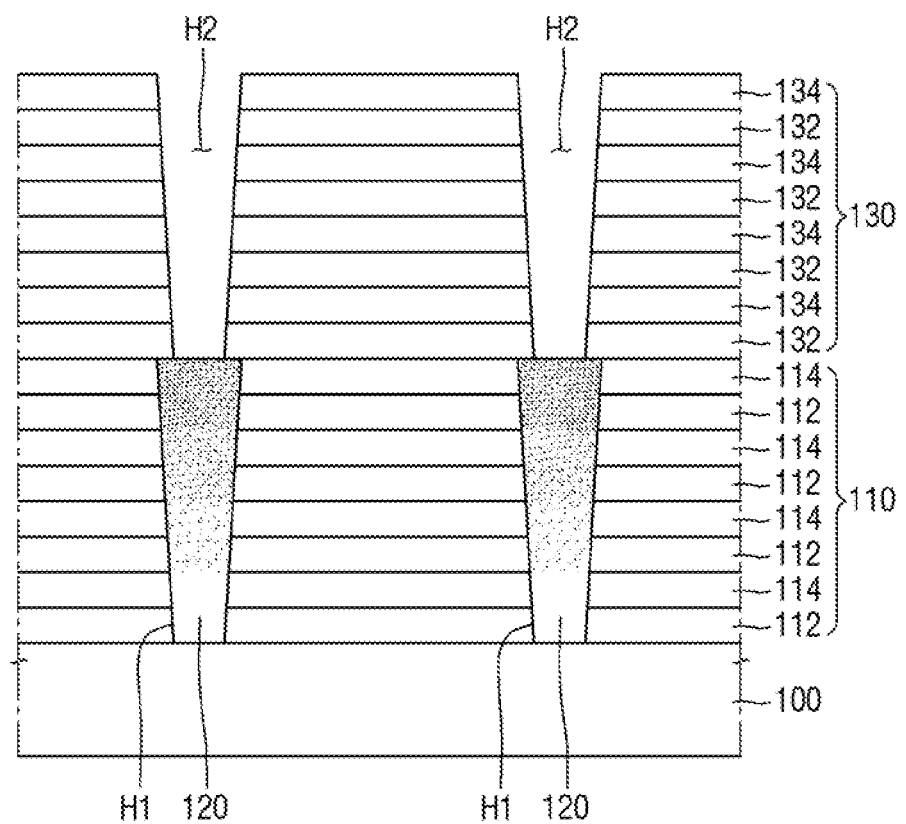

Referring to FIGS. 1 and 6, a second hole H2 is formed in the upper structure 130 (S500).

Figure 13:
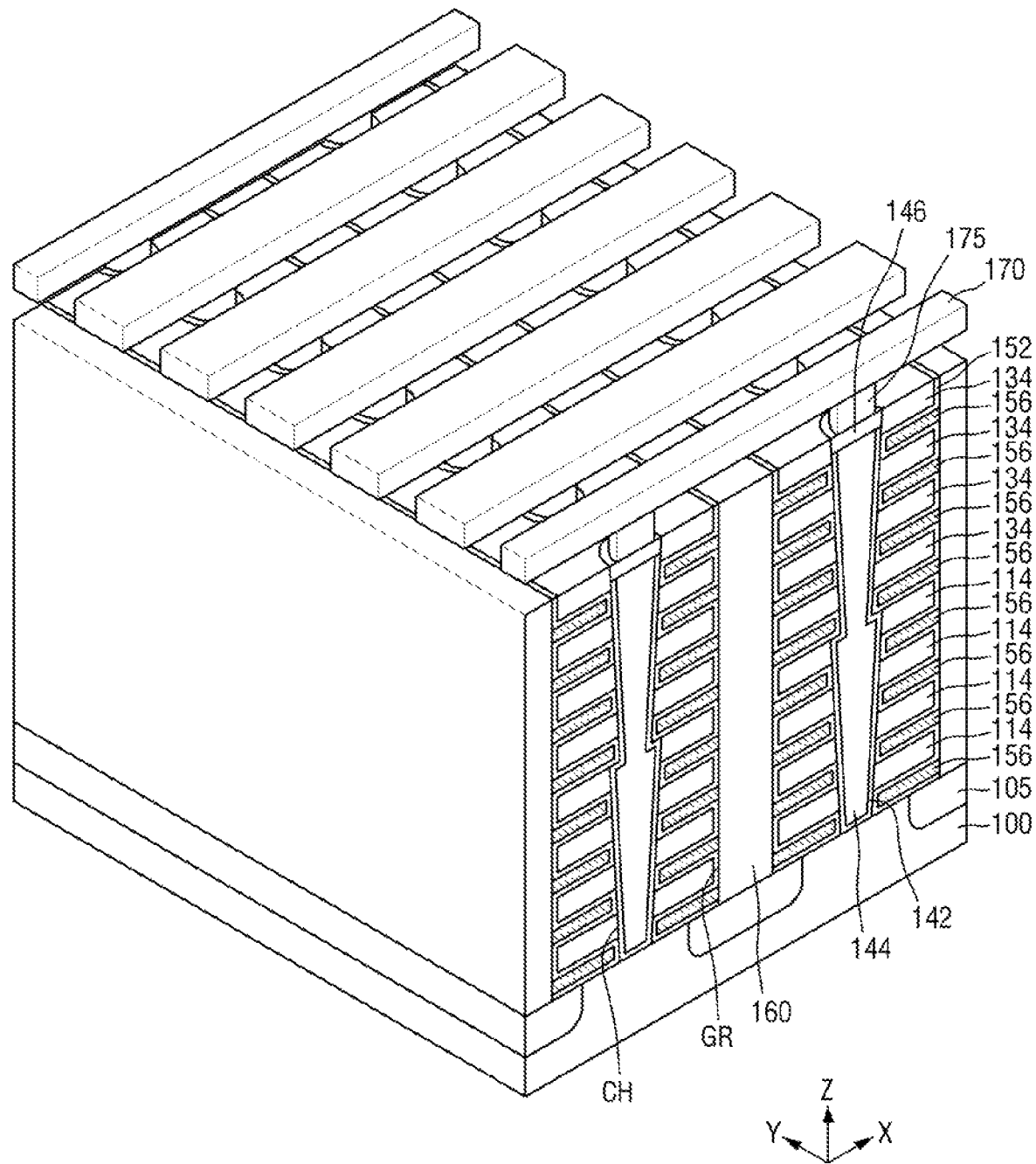

For example, a part of the upper structure 130 may be etched to form a second hole H2 which penetrates the second sacrificial layer 132 and the second insulating layer 134. The second hole H2 may expose the sacrificial pattern 120. For example, a second hole H2 which overlaps the first hole H1 may be formed. Here, the term "overlap" means overlap in a direction (e.g., a Z direction as shown in FIG. 13) perpendicular to the upper surface of the substrate 100. As the second hole H2 may also have a shape that narrows in a direction closer to the substrate 100, at a location where the second hole H2 contacts the first hole H1, the second hole H2 may be substantially narrower than the first hole H1.

In FIG. 6, the second hole H2 is illustrated to be formed until the upper surface of the sacrificial pattern 120 is exposed, but the present disclosure is not limited thereto. For example, formation of the second hole H2 may include etching of a part of the upper part of the sacrificial pattern 120.

According to exemplary embodiments of the present inventive concept, the second hole H2 may have a tapered shape. For example, as illustrated, the width of the second hole H2 may become narrower toward the lower structure 110. The shape of these second hole H2 may be influence by the characteristics of the etching process for forming the second hole H2, but the second hole H2 may have other shapes.

Figure 7:
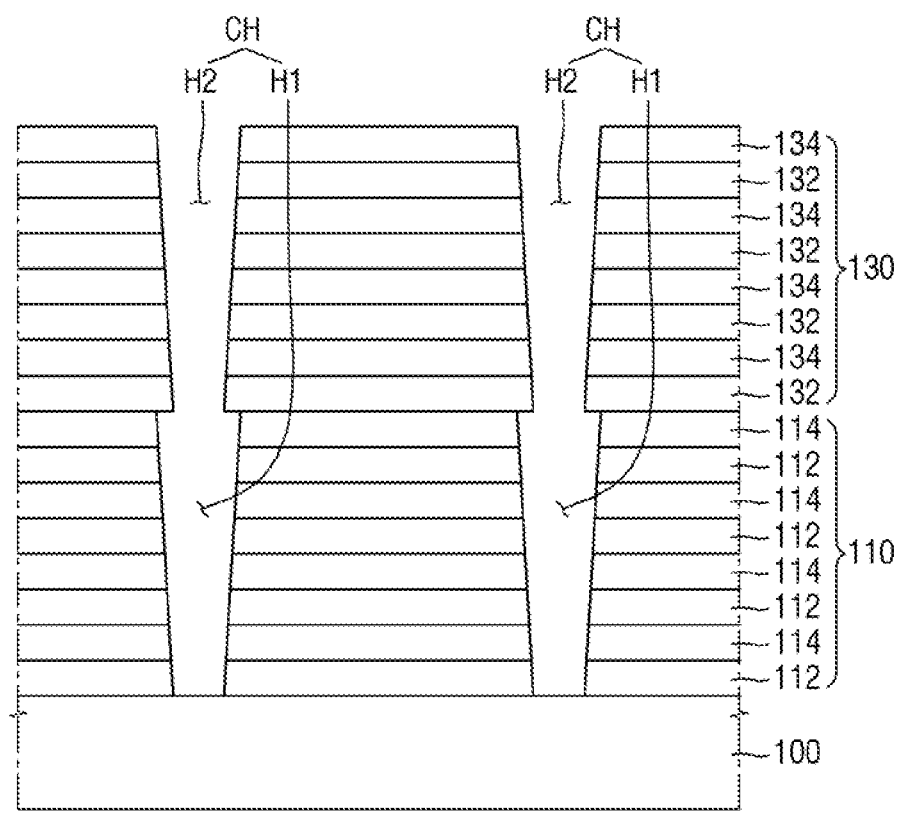

Referring to FIGS. 1 and 7, the sacrificial pattern 120 exposed by the second hole H2 is removed (S600).

For example, the sacrificial pattern 120 may be removed using an etching process having an etching rate that is greater for the sacrificial pattern 120 than for any one of the first sacrificial layer 112, the first insulating layer 114, the second sacrificial layer 132 and the second insulating layer 134. For example, in removing the sacrificial pattern 120, the first sacrificial layer 112, the first insulating layer 114, the second sacrificial layer 132, and the second insulating layer 134 are hardly etched.

Thus, the first hole H1 and the second hole H2 may be connected to each other. Further, the first hole H1 and the second hole H2 may be together contemplated as a single through-hole CH. The through-hole CH may penetrate the first sacrificial layer 112, the first insulating layer 114, the second sacrificial layer 132, and the second insulating layer 134. Further, the through-hole CH may expose a part of the upper surface of the substrate 100. The through-hole CH may function as a channel hole in which an active pattern (142 of FIG. 8), to be described later, is formed.

Removal of the sacrificial pattern 120 may be performed by, for example, a dry etching process or a wet etching process.

Figure 8:
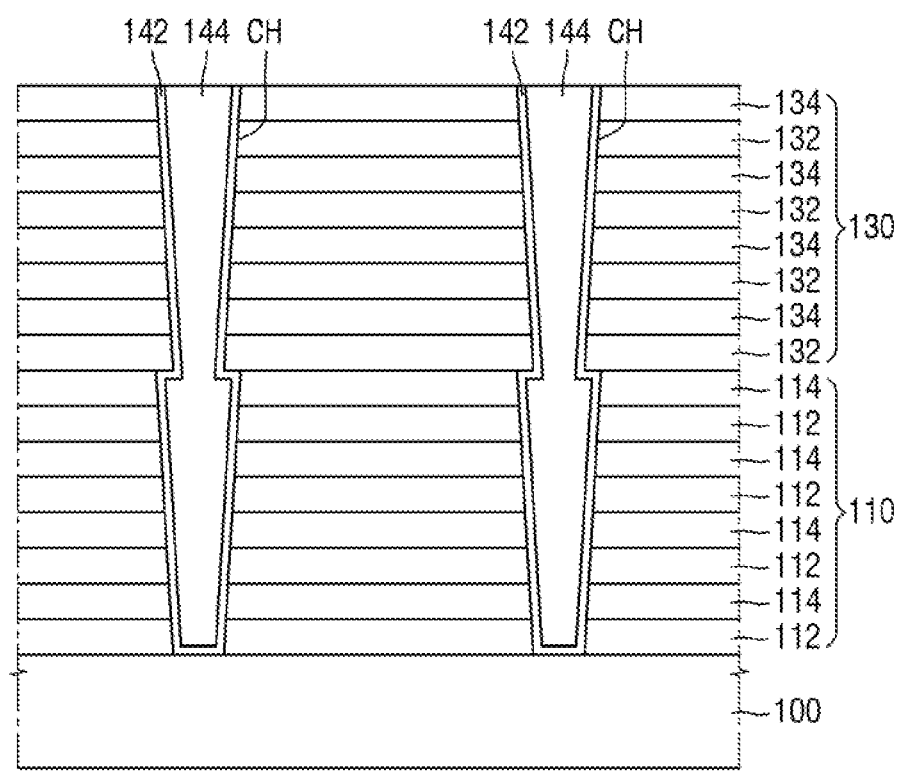

Referring to FIG. 8, an active pattern 142 and a first insulating pattern 144 are formed in the through-hole CH.

For example, a semiconductor layer may be formed in the lower structure 110 and the upper structure 130 in which the through-hole CH is formed. The semiconductor layer may be conformally formed along the profiles of the lower structure 110 and upper structure 130. Subsequently, an insulating layer may be formed on the semiconductor layer. The insulating layer may fill the remaining region of the through-hole CH in which the semiconductor layer is formed. Subsequently, a planarization process may be performed until the upper surface of the upper structure 130 is exposed. The planarization process may include, for example, a chemical mechanical polishing (CMP) process.

Accordingly, the active pattern 142 formed along the profile of the through-hole CH and including the semiconductor layer may be formed. Further, a first insulating pattern 144, which fills the remaining regions of the through-hole CH in which the active pattern 142 is formed, may be formed.

The active pattern 142 may include, for example, silicon, but is not limited thereto. The first insulating pattern 144 may include, but is not limited to including, for example, silicon oxide, silicon nitride, and/or silicon oxynitride.

Figure 9:
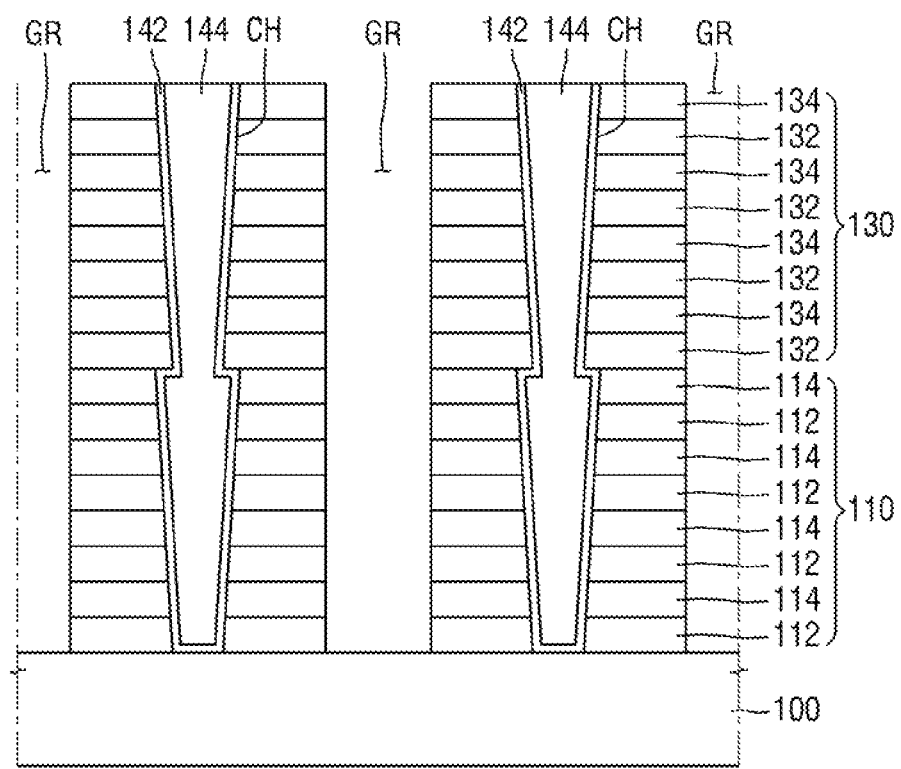

Referring to FIG. 9, a groove (GR) penetrating the lower structure 110 and the upper structure 130 is formed.

The groove (GR) may be spaced apart from the through-hole CH and may expose a part of the upper surface of the substrate 100. According to exemplary embodiments of the present inventive concept, the groove (GR) may extend in a first direction (e.g., the Y direction shown in FIG. 13).

The inner walls of the first sacrificial layer 112, the first insulating layer 114 the second sacrificial layer 132 and the second insulating layer 134 may be exposed by the groove (GR).

Figure 10:
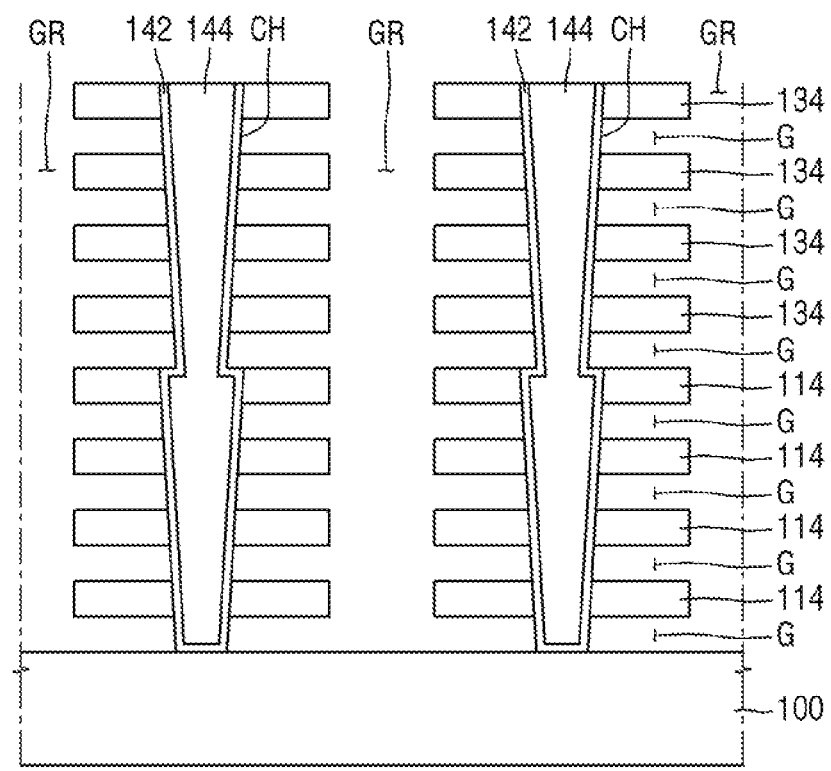

Referring to FIG. 10, the first sacrificial layer 112 and the second sacrificial layer 132 exposed by the groove (GR) are removed.

As a result of this removal, a plurality of gaps (G) may be formed between the first insulating layer 114 and the second insulating layer 134. As the gaps (G) are formed, a part of the sidewalls of the active pattern 142 may be exposed.

Figure 11:
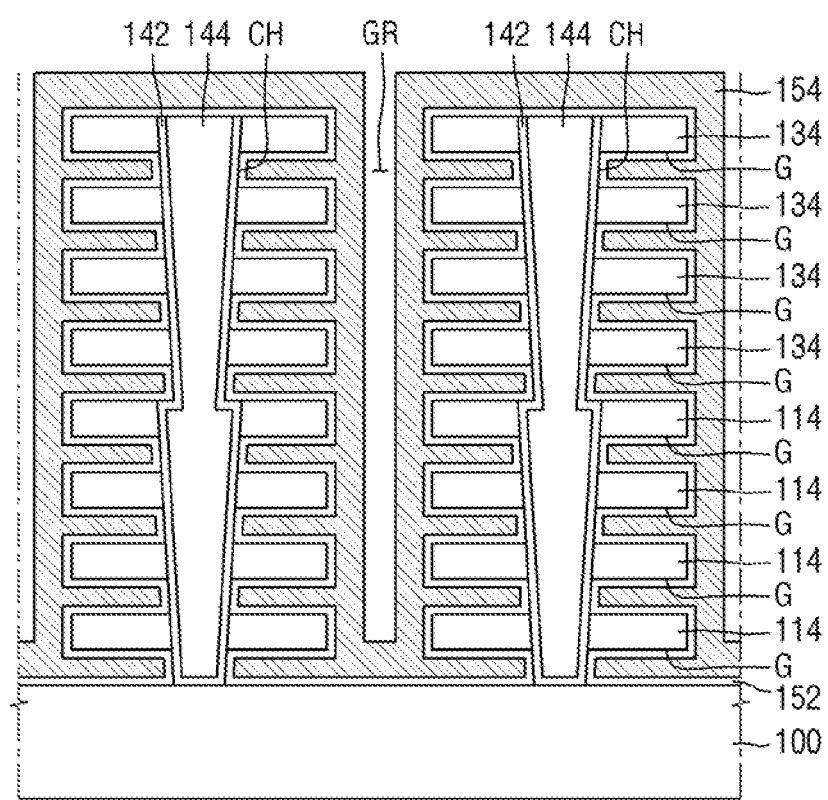

Referring to FIG. 11, an information storage layer 152 and a conductive layer 154 are formed on the active pattern 142.

For example, the information storage layer 152 may be formed along the profiles of the active pattern 142, the first insulating layer 114, and the second insulating layer 134 exposed by the gap (G). Subsequently, the conductive layer 154 may be formed on the information storage layer 152. The conductive layer 154 may fill the remaining regions of the gap (G) in which the information storage layer 152 is formed.

The conductive layer 154 may include, but is not limited to including, for example, doped silicon, tungsten, conductive metal nitride, and/or metal-semiconductor compound.

According to exemplary embodiments of the present inventive concept, the information storage layer 152 may include a tunnel dielectric layer, a charge storage layer and a blocking dielectric layer. The charge storage layer may include a dielectric layer having traps of a deep level capable of storing the charge. For example, the charge storage layer may include nitride and/or insulating metal oxide (e.g., aluminum oxide and/or hafnium oxide, etc.). The tunnel dielectric layer may include a thermal oxide. The tunnel dielectric layer may be formed as a single layer or may include multiple layers. For example, the tunnel dielectric layer may include silicon oxide, silicon oxynitride and/or silicon nitride. The blocking dielectric layer may be formed as a single layer or may include multiple layers. For example, the above-mentioned blocking dielectric layer may contain silicon oxide and/or a high dielectric. The high dielectric is understood to be a dielectric material having a dielectric constant higher than that of the tunnel dielectric layer. For example, the high dielectric may include an insulating metal oxide such as aluminum oxide or hafnium oxide.

According to exemplary embodiments of the present inventive concept, the information storage layer 152 may include a charge storage layer and a blocking dielectric layer. In such a case, the tunnel dielectric layer may be interposed between the active pattern 142 and the information storage layer 152. For example, the tunnel dielectric layer may be formed on the sidewall of the through-hole CH before the active pattern 142 is formed.

According to exemplary embodiments of the present inventive concept, the information storage layer 152 may include a blocking dielectric layer. In such a case, the tunnel dielectric layer and the charge storage layer may be formed between the active pattern 142 and the information storage layer 152. For example, the tunnel dielectric layer and the charge storage layer may be formed on the sidewall of the through-hole CH before the active pattern 142 is formed.

Figure 12:
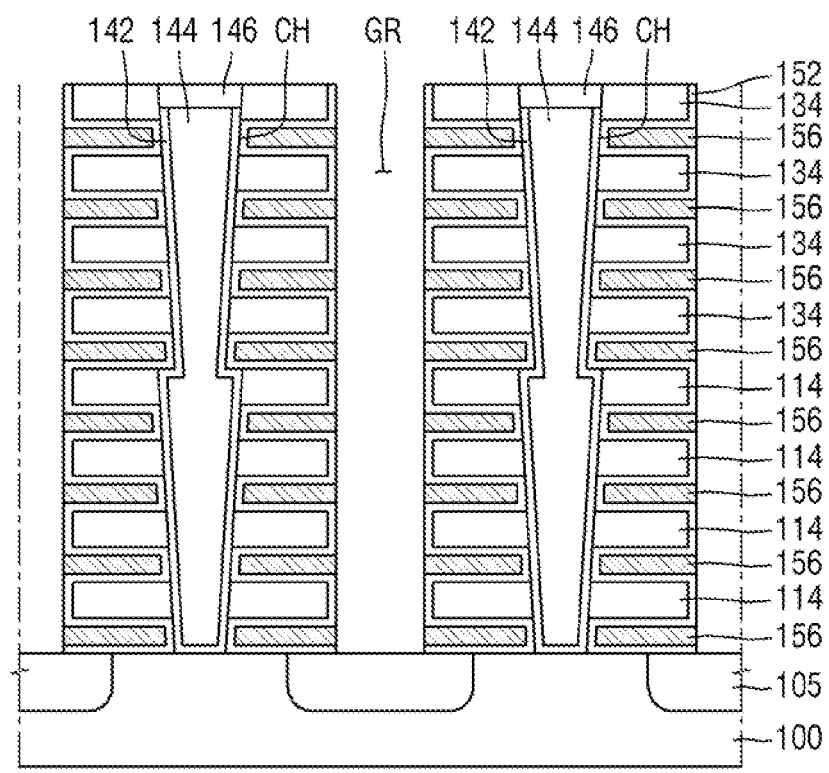

Referring to FIG. 12, a gate pattern 156 is formed in the gap (G).

For example, the conductive layer 154 outside the gap (G) may be removed. Removal of the conductive layer 154 outside the gap (G) may be performed by, for example, a planarization process, an isotropic etching process, and/or an anisotropic etching process.

Therefore, a plurality of gate patterns 156 arranged in the respective gaps G may be formed. The respective gate patterns 156 may be spaced apart from each other by the first insulating layer 114 and the second insulating layer 134. The gate pattern 156 is illustrated to further protrude from the first insulating layer 114 and the second insulating layer 134, but the present disclosure is not limited thereto.

According to exemplary embodiments of the present inventive concept, the thickness of the uppermost lowermost gate patterns 156 may be greater than the thicknesses of other gate patterns 156.

According to exemplary embodiments of the present inventive concept, the uppermost gate pattern 156 may include a string selection transistor, and the lowermost gate pattern 156 may include a ground selection transistor. Further, other gate patterns 156 between the uppermost and lowermost gate patterns 156 may include a plurality of cell transistors.

Subsequently, a first impurity region 105 and a second impurity region 146 are formed.

For example, the information storage layer 152 on the substrate 100 exposed by the groove (GR) may be removed. Subsequently, the first impurity region 105 may be formed in the substrate 100 exposed by the groove (GR). Like the groove (GR), the first impurity region 105 may extend along a first direction (for example, the Y direction of FIG. 13). The first impurity region 105 may be formed, for example, by an ion implantation process. According to exemplary embodiments of the present inventive concept, the first impurity region 105 may include a common source line (CSL).

For example, the planarization process may be performed until the upper surface of the active pattern 142 is exposed. Subsequently, the second impurity region 146 may be formed in the exposed active pattern 142. As a result, the second impurity region 146 may be formed on the active pattern 142. The second impurity region 146 may be formed, for example, by an ion implantation process. According to exemplary embodiments of the present inventive concept, the second impurity region 146 may include a drain.

Subsequently, referring to FIG. 13, a second insulating pattern 160 is formed in the groove (GR). For reference, FIG. 13 is a perspective view of a semiconductor device formed in accordance with the method for fabricating the semiconductor device according to exemplary embodiments of the present inventive concept.

The second insulating pattern 160 may fill the groove (GR). Like the groove (GR), the second insulating pattern 160 may extend along the first direction Y. The second insulating pattern 160 may include for example, silicon oxide, silicon nitride, and/or silicon oxynitride.

According to exemplary embodiments of the present inventive concept, a contact plug 175 may be formed on the active pattern 142. The contact plug 175 may be electrically connected to the second impurity region 146 on the active pattern 142. Further, a wiring 170 electrically connected to the contact plug 175 may be formed. The wiring 170 may extend, for example, in a second direction X intersecting the first direction Y. According to exemplary embodiments of the present inventive concept, the wiring 170 may include a bit-line.

In FIG. 13, the plurality of active patterns 142 is illustrated as being arranged in a line along the first direction Y, but the present disclosure is not limited thereto. For example, according to exemplary embodiments of the present inventive concept, the plurality of active patterns 142 may be arranged in zigzag pattern along the first direction Y.

A plurality of etching processes may be utilized to form a through-hole having a high aspect ratio. For example, in a multi stack NAND memory process, two or more etching processes may be used to form a channel hole. However, as the semiconductor devices are increasingly highly integrated, there is a problem that sacrificial materials required for maintaining the lower structure are not easily removed at the time of formation of the upper structure and/or formation of through-hole (or channel hole). For example, a first hole may be formed in the lower structure on the substrate, and a second hole overlapping the first hole may be formed in the upper structure. However, the sacrificial pattern for supporting the first hole in the lower structure might not be easily removed. In particular, the lower part of the sacrificial pattern might not be easily removed due to the high aspect ratio of the through-hole.

However, the method for fabricating the semiconductor device, according to exemplary embodiments of the present inventive concept, may more easily form the through-hole with a high aspect ratio, by using the sacrificial pattern 120 in which the porosity increases toward the substrate 100. For example, the lower part of the sacrificial pattern 120 having a high porosity may be easily removed by an etching process for removing the sacrificial pattern 120.

The method for fabricating the semiconductor device, according to exemplary embodiments of the present inventive concept, may firmly support the lower structure 110, using the sacrificial pattern 120. For example, the upper part of the sacrificial pattern 120 having a low porosity may be more firmly maintained than the lower part of the sacrificial pattern 120 having a high porosity. As a result, when the upper structure 130 is formed on the lower structure 110, the upper part of the sacrificial pattern 120 having a low porosity may firmly support the shape of the first hole H1.

Hereinafter, the formation of the sacrificial pattern 120, according to exemplary embodiments of the present inventive concept, will be described in more detail with reference to FIGS. 14 to 23.

Figure 14:
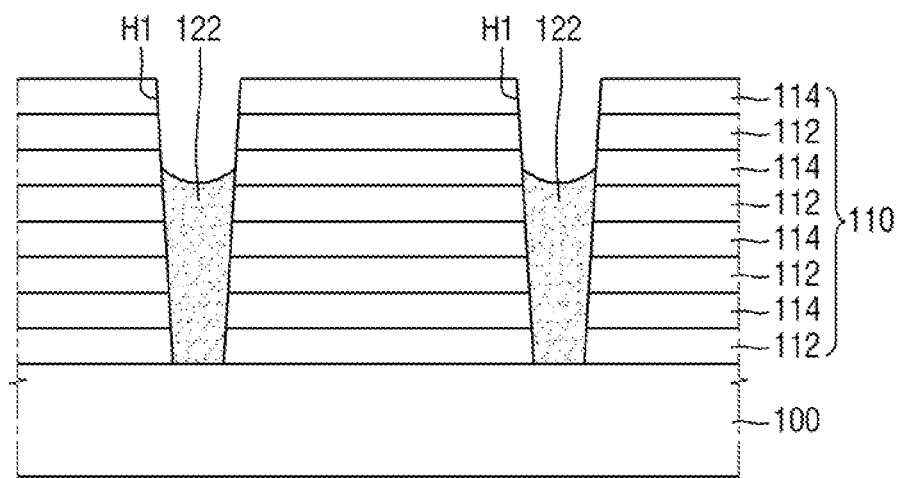
FIGS. 14 and 15 are diagrams illustrating intermediate stages in a method for fabricating a semiconductor device, according to exemplary embodiments of the present inventive concept.
Figure 15:
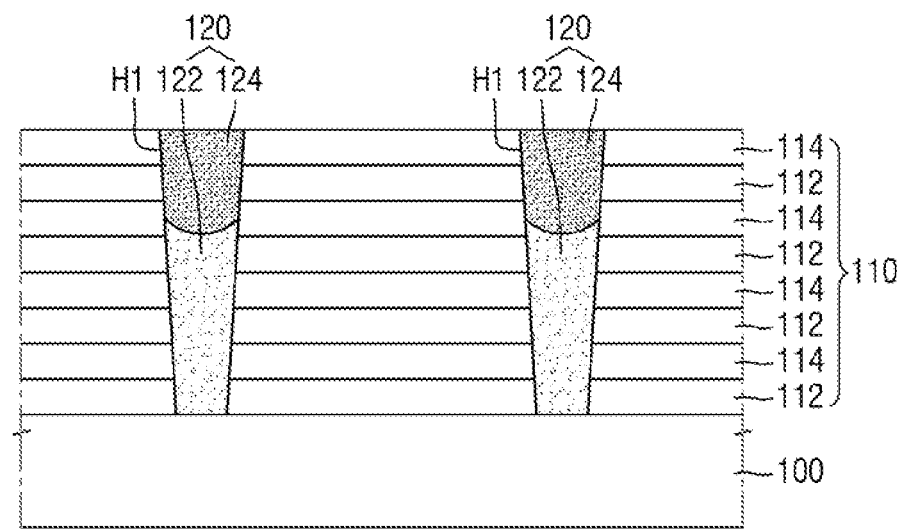

FIGS. 14 and 15 are diagrams illustrating intermediate steps of a method for fabricating a semiconductor device according to exemplary embodiments of the present inventive concept. For reference, FIG. 14 is a diagram illustrating the steps subsequent to what is shown in FIG. 3. For the sake of convenience of explanation, the repeated parts of those described with reference to FIGS. 1 to 13 will be briefly explained or omitted and it is to be understood that to the extent that details are omitted, these details may be assumed to be at least similar to those of corresponding elements that have already been described elsewhere the present disclosure.

Referring to FIG. 14, a first material pattern 122 is formed in the first hole H1.

According to exemplary embodiments of the present inventive concept, formation of the first material pattern 122 may include performing a spin coating process. For example, a liquefied first sacrificial material may be provided on the lower structure 110. Next, a first spin coating process may be performed so that the first sacrificial material fills at least a part of the first hole H1.

The first sacrificial material may include a precursor for forming a sacrificial pattern (120 of FIG. 4). For example, when the sacrificial pattern 120 includes polysilicon, the first sacrificial material may include a silicon precursor. According to exemplary embodiments of the present inventive concept, the first sacrificial material may include cyclopentasilane and/or cyclohexasilane.

The first material pattern 122 may partially fill the first hole H1. For example, the rotational speed of the first spin coating process may be adjusted to form the first material pattern 122 which fills a part of the first hole H1. Alternatively, for example, after performing the first spin coating process, the recess process of the first material pattern 122 may be performed. As a result, the first material pattern 122 for filling a part of the first hole H1 may be formed.

According to exemplary embodiments of the present inventive concept, the first material pattern 122 may have a predetermined first porosity. For example, at a predetermined first temperature, the first spin coating process may be performed at a predetermined first rotational speed, using the first sacrificial material of a predetermined first concentration. The first temperature may be, but is not limited to, for example, a temperature higher than a room temperature.

Referring to FIG. 15, a second material pattern 124 is formed on the first material pattern 122.

According to exemplary embodiments of the present inventive concept, formation of the second material pattern 124 may include execution of the spin coating process. For example, a liquefied second sacrificial material may be provided on the top of the lower structure 110 and the first material pattern 122. Subsequently, the second spin coating process may be performed so that the second sacrificial material fills the first hole H1 on the first material pattern 122. According to exemplary embodiments of the present inventive concept, the second spin coating process may be performed in-situ with the first spin coating process.

The second sacrificial material may include a precursor for forming a sacrificial pattern (120 of FIG. 4). For example, when the sacrificial pattern 120 includes polysilicon, the second sacrificial material may include a silicon precursor. According to exemplary embodiments of the present inventive concept, the second sacrificial material may include cyclopentasilane, and/or cyclohexasilane.

According to exemplary embodiments of the present inventive concept, the first material pattern 122 and the second material pattern 124 may include substantially the same material. However, the present disclosure is not limited thereto, and the second material pattern 124 may include materials different from the first material pattern 122. For example, the second material pattern 124 may also include other materials that are stronger than the first material pattern 122.

The second material pattern 124 may fill the remaining regions of the first hole H1 in which the first material pattern 122 is formed. For example, the second sacrificial material for filling the first hole H1 may be formed on the lower structure 110 and the first material pattern 122, using the second spin coating process. Subsequently, a planarization process may be performed until the upper surface of the lower structure 110 is exposed. As a result, the sacrificial pattern 120 including the first material pattern 122 and the second material pattern 124 may be formed in the first hole H1.

According to exemplary embodiments of the present inventive concept, the second material pattern 124 may have a predetermined second porosity. For example, at a predetermined second temperature, the second spin coating process may be performed at a second predetermined rotational speed, using the second sacrificial material of a predetermined second concentration. The second temperature may be, but is not limited to being, for example, room temperature.

According to exemplary embodiments of the present inventive concept, the second porosity of the second material pattern 124 may be lower than the first porosity of the first material pattern 122.

For example, the second temperature at which the second spin coating process is performed may be lower than the first temperature at which the first spinning process is performed. Since the solvent mixed with the sacrificial material may be more slowly removed as the temperature of the spin coating process is lower, a material pattern having a low porosity may be formed. On the other hand, since the solvent mixed with the sacrificial material may be more rapidly removed as the temperature of the spin coating process is higher, a material pattern having a high porosity may be formed. As a result, the sacrificial pattern 120 in which the porosity increases toward the substrate 100 may be formed.

For example, the second concentration of the second sacrificial material may be higher than the first concentration of the first sacrificial material. As the concentration of the sacrificial material is higher, a material pattern having a lower porosity may be formed. As a result, a sacrificial pattern 120 in which the porosity increases toward the substrate 100 may be formed.

Although the sacrificial pattern 120 has been described to include only two material patterns, the present disclosure is not limited thereto. For example, the second material pattern 124 may be formed so as not to completely fill the upper part of the first hole H1, and the steps of FIG. 15 may be repeated. For example, the sacrificial pattern 120 may include three or more material patterns for filling at least a part of the first hole H1.

According to exemplary embodiments of the present inventive concept, other materials for filling the first hole H1 may be formed on the second material pattern 124. For example, the second material pattern 124 may be formed so as not to completely fill the upper part of the first hole H1, and the third material pattern may be formed on the second material pattern 124. According to exemplary embodiments of the present inventive concept, the third material pattern may include other materials that are stronger than the first material pattern 122 or the second material pattern 124. For example, the third material pattern may include tungsten.

Figure 16:
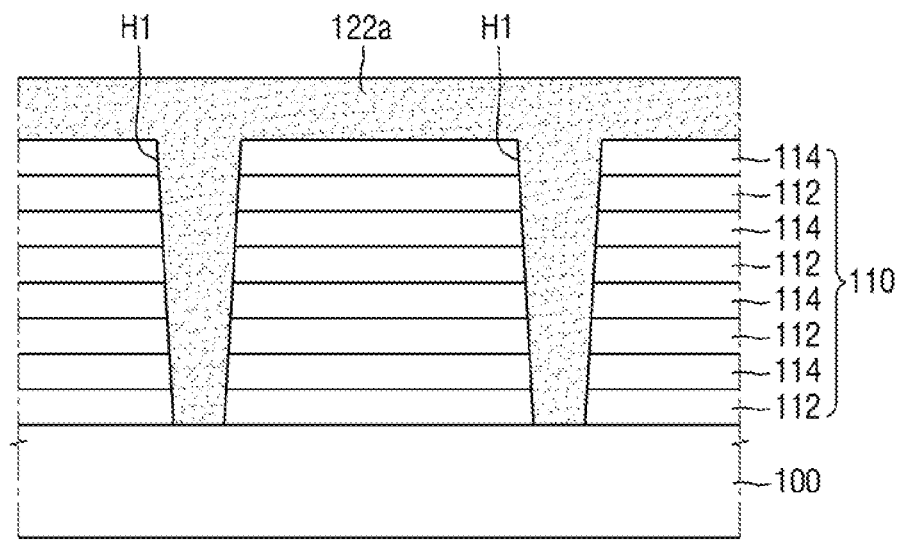
FIGS. 16 to 18 are diagrams illustrating intermediate steps in a method for fabricating a semiconductor device, according to exemplary embodiments of the present inventive concept.
Figure 17:
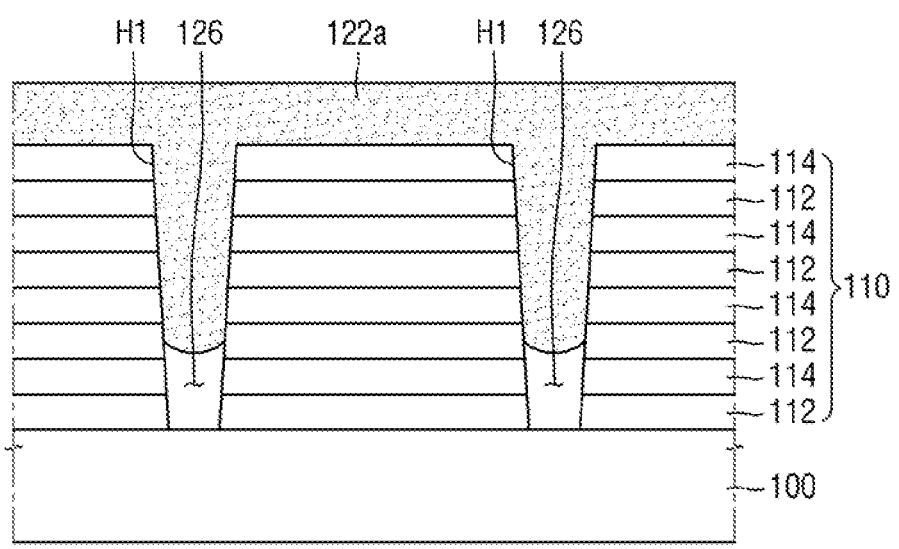
Figure 18:
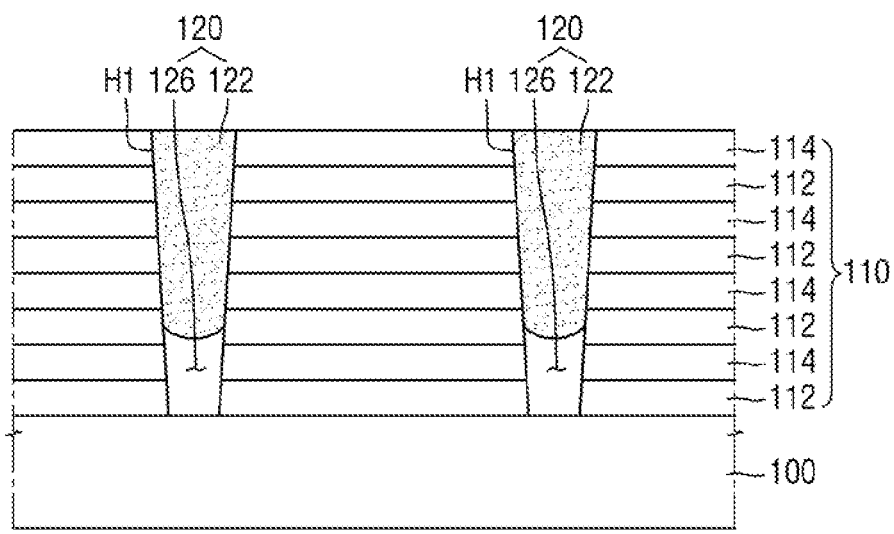

FIGS. 16 to 18 are diagrams illustrating intermediate steps in a method for fabricating the semiconductor device, according to exemplary embodiments of the present inventive concept. For reference, FIG. 16 is a diagram illustrating processing steps that occur subsequent to what is illustrated in FIG. 3. For the sake of convenience of explanation, repeated parts of those described with reference to FIGS. 1 to 15 will be briefly described or omitted and it is to be understood that to the extent that details are omitted, these details may be assumed to be at least similar to those of corresponding elements that have already been described elsewhere the present disclosure.

Referring to FIG. 16, a first material layer 122a is formed in the first hole H1.

According to exemplary embodiments of the present inventive concept, formation of the first material layer 122a may include execution of the spin coating process. For example, the first sacrificial material may be provided on the lower structure 110. Next, the first material layer 122a for filling the first hole H1 may be formed on the lower structure 110, using the first spin coating process.

Referring to FIG. 17, a void 126 is formed under the first material layer 122a.

According to exemplary embodiments of the present inventive concept, formation of the void 126 may include execution of a thermal process. For example, heat may be provided to the first material layer 122a, using the thermal process. As the solvent in the first material layer 122a is removed by the heat provided to the first material layer 122a, the first material layer 122a may shrink. As a result, the void 126 may be formed under the first material layer 122a.

According to exemplary embodiments of the present inventive concept, the thermal process may be performed in situ with the first spin coating process. The thermal process may be performed substantially simultaneously with the first spin coating process, but the present disclosure is not limited thereto. For example, the thermal process may be performed after the first spin coating process is performed.

Referring to FIG. 18, a first material pattern 122 is formed inside the first hole H1.

For example, the planarization process of the first material layer 122a may be performed until the upper surface of the lower structure 110 is exposed. The planarization process may include, for example, a chemical mechanical polishing process, but is not limited thereto. As a result, the sacrificial pattern 120 including the first material pattern 122 and the void 126 may be formed in the first hole H1. For example, the sacrificial pattern 120 in which the porosity increases toward the substrate 100 may be formed.

Figure 19:
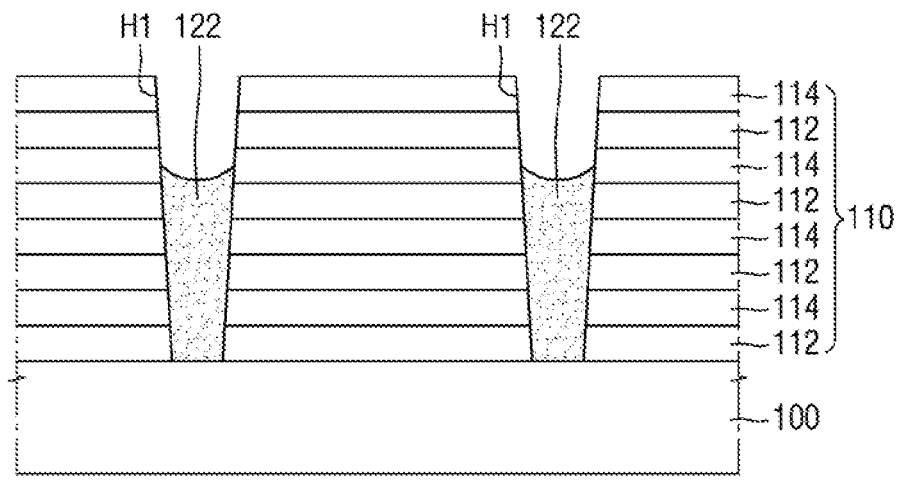
FIGS. 19 to 22 are diagrams illustrating intermediate steps in a method for fabricating a semiconductor device, according to exemplary embodiments of the present inventive concept.

FIGS. 19 to 22 are intermediate step diagrams illustrating a method for fabricating the semiconductor device, according to exemplary embodiments of the present inventive concept. For reference, FIG. 19 is a diagram illustrating a state of processing occurring subsequent to those of FIG. 3. For the sake of convenience of explanation, repeated parts of those described with reference to FIGS. 1 to 18 will be briefly described or omitted and it is to be understood that to the extent that details are omitted, these details may be assumed to be at least similar to those of corresponding elements that have already been described elsewhere the present disclosure.

Referring to FIG. 19, the first material pattern 122 is formed in the first hole H1.

Since the formation of the first material pattern 122 is substantially the same as that described with reference to FIG. 14, the detailed description thereof will not be provided below.

Figure 20:
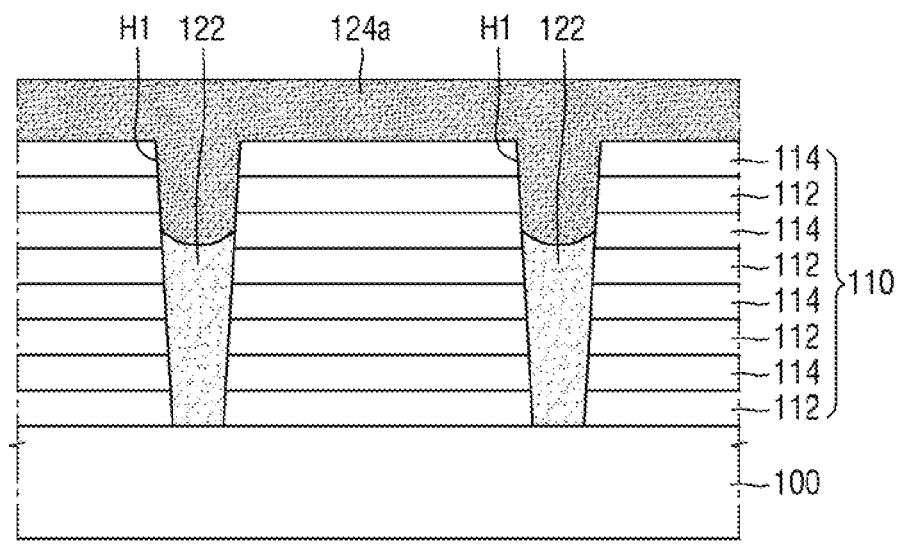

Referring to FIG. 20, a second material layer 124a is formed on the first material pattern 122.

According to exemplary embodiments of the present inventive concept, formation of the second material layer 124a may include execution of the spin coating process. For example, the second sacrificial material may be provided on the lower structure 110 and the first material pattern 122. Subsequently, a second material layer 124a for filling the first hole H1 may be formed on the lower structure 110 and the first material pattern 122, using the second spin coating process.

According to exemplary embodiments of the present inventive concept, the second porosity of the second material pattern 124 may be lower than the first porosity of the first material pattern 122.

Figure 21:
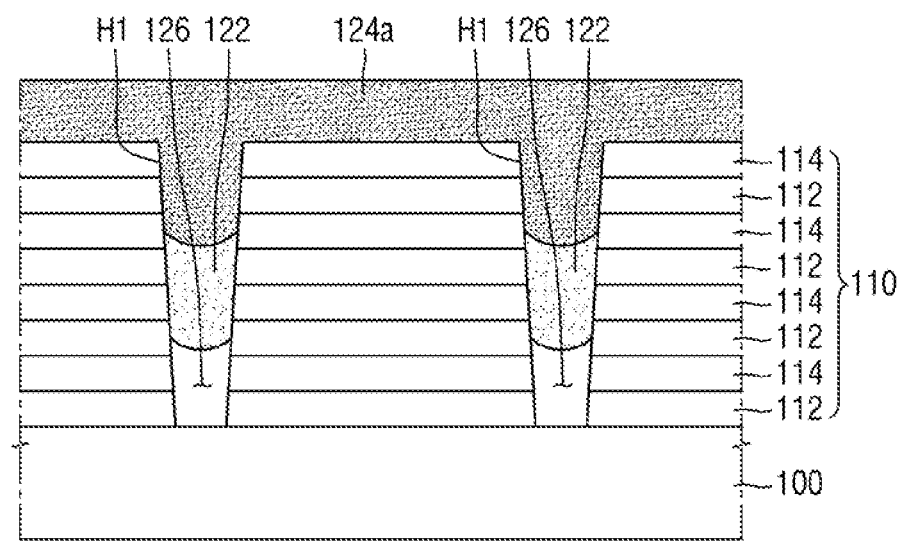

Referring to FIG. 21, a void 126 is formed under the first material pattern 122.

According to exemplary embodiments of the present inventive concept, formation of the void 126 may include execution of a thermal process. Since formation of the void 126 is similar to that described with reference to FIG. 17, detailed description thereof will not be provided below.

Figure 22:
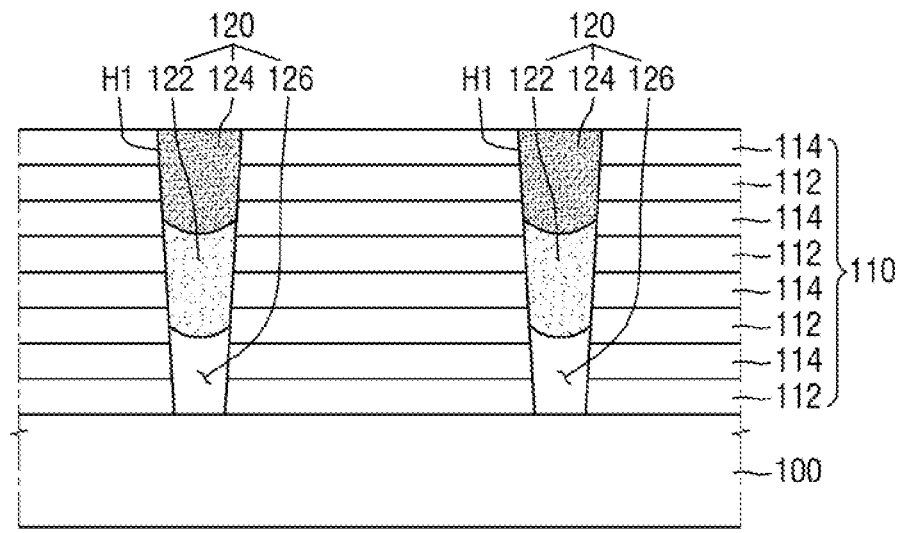

Referring to FIG. 22, a second material pattern 124 is formed inside the first hole H1.

For example, the planarization process on the second material layer 124a may be performed until the upper surface of the lower structure 110 is exposed. The planarization process may include, but is not limited to including, for example, a chemical mechanical polishing process. As a result, a sacrificial pattern 120 including the first material pattern 122, the second material pattern 124 and the void 126 may be formed in the first hole H1. For example, the sacrificial pattern 120 in which the porosity increases toward the substrate 100 may be formed.

Figure 23:
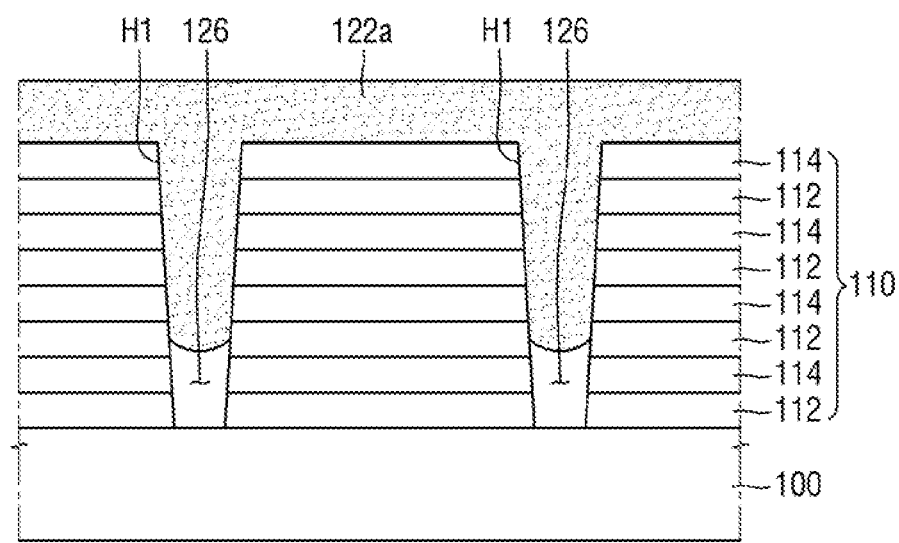
FIG. 23 is a diagram illustrating an intermediate step in a method for fabricating a semiconductor device, according to exemplary embodiments of the present inventive concept.

FIG. 23 is an intermediate step diagram illustrating the method for fabricating the semiconductor device, according to exemplary embodiments of the present inventive concept. For reference, FIG. 23 is a diagram illustrating a state of processing that occurs subsequent to what is shown in FIG. 3. For the sake of convenience of explanation, the repeated parts of those described with reference to FIGS. 1 to 22 will be briefly explained or omitted and it is to be understood that to the extent that details are omitted, these details may be assumed to be at least similar to those of corresponding elements that have already been described elsewhere the present disclosure.

Referring to FIG. 23, the first material layer 122a and the void 126 under the first material layer 122a are formed in the first hole H1.

The first material layer 122a may partially fill the first hole H1. For example, the rotational speed of the first spin coating process may be adjusted to form the first material layer 122a for filling a part of the first hole H1.

According to exemplary embodiments of the present inventive concept, the first spin coating process may be performed in situ with the thermal process. For example, the first spin coating process may be performed substantially simultaneously with the thermal process.

Subsequently, referring to FIG. 18, the first material pattern 122 in the first hole H1 is formed. As a result, the sacrificial pattern 120 including the first material pattern 122 and the void 126 may be formed in the first hole H1. For example, the sacrificial pattern 120 in which the porosity increases toward the substrate 100 may be formed.

Hereinafter, fabricating equipment of the semiconductor device, according to exemplary embodiments of the present inventive concept, will be described with reference to FIGS. 24 to 27.

Figure 24:
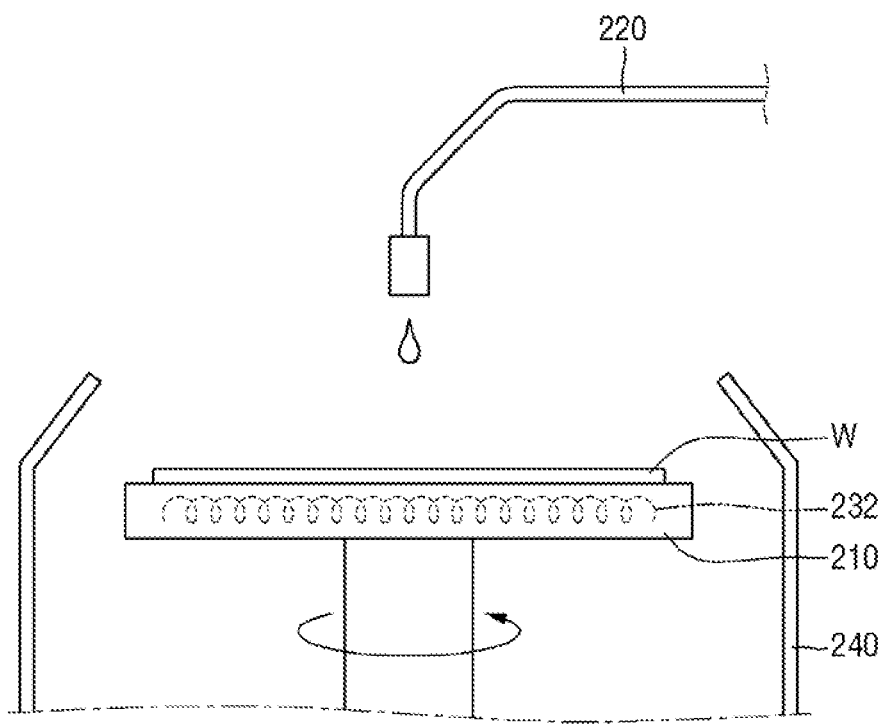
FIG. 24 is a schematic diagram illustrating fabricating equipment of a semiconductor device, according to exemplary embodiments of the present inventive concept.

FIG. 24 is a schematic diagram illustrating fabricating equipment of the semiconductor device, according to exemplary embodiments of the present inventive concept. For the sake of convenience of explanation, the repeated parts of those described with reference to FIGS. 1 to 23 will be briefly explained or omitted and it is to be understood that to the extent that details are omitted, these details may be assumed to be at least similar to those of corresponding elements that have already been described elsewhere the present disclosure.

Referring to FIG. 24, the fabricating equipment of the semiconductor device, according to exemplary embodiments of the present inventive concept, performs the spin coating process. For example, the fabricating equipment of the semiconductor device, according to exemplary embodiments of the present inventive concept, includes a wafer support 210, a sacrificial material provider 220, and a first temperature adjuster 232.

The wafer W may be placed on the wafer support 210. For example, the wafer support 210 may include a chuck. The wafer support 210 may also be rotatable. As a result, the wafer W is fixed to the wafer support 210 and the wafer W may be rotated at a predetermined rotational speed by the wafer support 210.

The wafer support 210 is, for example, connected by a rotating shaft that transmits the rotational force of the rotating motor, and may rotate at a predetermined rotational speed.

According to exemplary embodiments of the present inventive concept, the wafer W may include the lower structure 110 in which the first sacrificial layer 112 and the first insulating layer 114 are alternately stacked on the substrate 100. Also, according to exemplary embodiments of the present inventive concept, the lower structure 110 may include a first hole H1 which exposes the upper surface of the substrate 100.

The sacrificial material provider 220 may be disposed on the wafer support 210. The sacrificial material provider 220 may provide the sacrificial material onto the wafer W on the wafer support 210.

The sacrificial material provider 220 may include, for example, a nozzle. According to exemplary embodiments of the present inventive concept, the sacrificial material provider 220 may be operated. For example, when no sacrificial material is provided, the sacrificial material provider 220 may be operated to move away from the wafer support 210. Or, for example, when the sacrificial material is provided, the sacrificial material provider 220 may be operated to be placed on the wafer support 210. Alternatively, for example, the sacrificial material provider 220 may be operated in a vertical direction perpendicular to the wafer W.

The sacrificial material provider 220 may provide a liquefied first sacrificial material or liquefied second sacrificial material on the wafer W. The sacrificial material provider 220 may, for example, adjust the amount of solvent mixed with the sacrificial material to provide the first sacrificial material or the second sacrificial material of different concentrations.

The first sacrificial material or the second sacrificial material may include a precursor for forming the sacrificial pattern (120 of FIG. 4). For example, the first sacrificial material or the second sacrificial material may include a silicon precursor. According to exemplary embodiments of the present inventive concept, the first sacrificial material or the second sacrificial material may include cyclopentasilane, and/or cyclohexasilane.

According to exemplary embodiments of the present inventive concept, the first sacrificial material and the second sacrificial material may include substantially the same materials, but the present disclosure is not limited thereto. For example, the first sacrificial material and the second sacrificial material may also include materials different from each other.

According to exemplary embodiments of the present inventive concept, the sacrificial material provider 220 may provide the first sacrificial material of the first concentration of on the wafer W, and then may provide the second sacrificial material of the second concentration higher than the first concentration on the wafer W.

According to exemplary embodiments of the present inventive concept, the sacrificial material provider 220 may provide the first sacrificial material or the second sacrificial material into the first hole H1 of the lower structure 110.

The first temperature adjuster 232 may adjust the temperature of the wafer W. Although the first temperature adjuster 232 is illustrated as being located in the wafer support 210, the present disclosure is not limited thereto. As long as the first temperature adjuster 232 is operational to adjust the temperature of the wafer W, the first temperature adjuster 232 may be disposed at various positions and in various ways.

According to exemplary embodiments of the present inventive concept, the first temperature adjuster 232 may provide the first temperature to the wafer W, when the first sacrificial material of first concentration is provided on the wafer W. Further, the first temperature adjuster 232 may provide a second temperature lower than the first temperature on the wafer W, when the second sacrificial material of second concentration higher than the first concentration is provided on the wafer W.

According to exemplary embodiments of the present inventive concept, a bowl 240 which surrounds the outside of the wafer support 210 may be disposed. The bowl 240 may prevent the sacrificial material provided on the wafer W from jumping out as the wafer W rotates.

Therefore, the fabricating equipment of the semiconductor device, according to exemplary embodiments of the present inventive concept, may form a sacrificial pattern that is strong and easy to remove at the time of forming the through-hole with a high aspect ratio.

Figure 25:
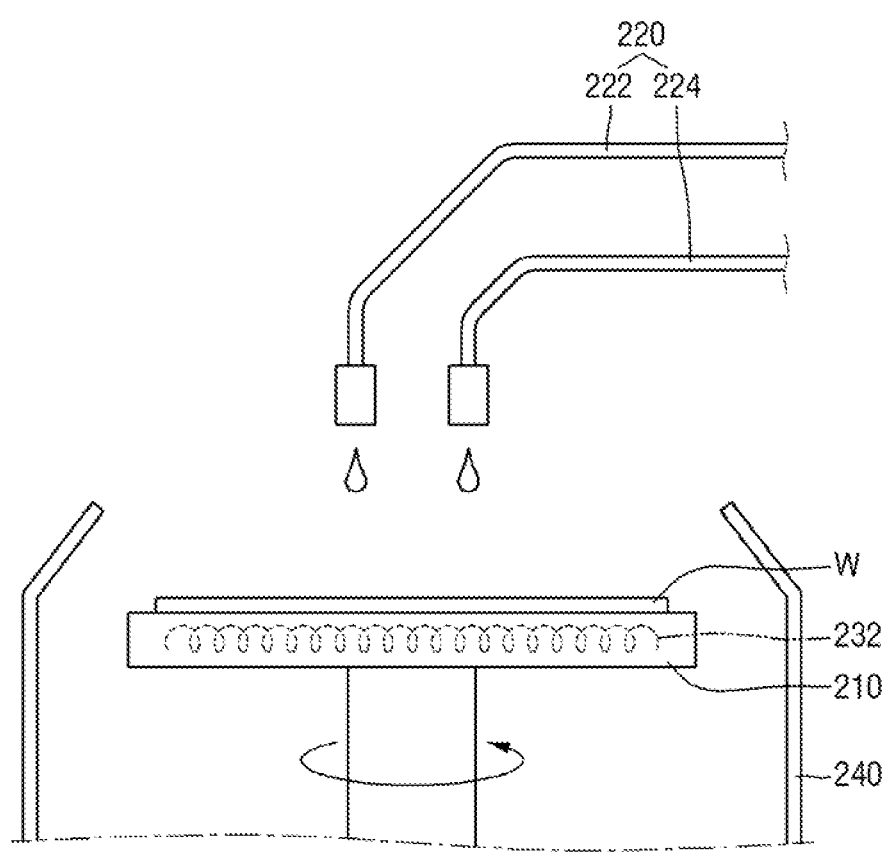
FIG. 25 is a schematic diagram illustrating fabricating equipment of a semiconductor device, according to exemplary embodiments of the present inventive concept.

FIG. 25 is a schematic diagram illustrating fabricating equipment of the semiconductor device, according to exemplary embodiments of the present inventive concept. For the sake of convenience of explanation, repeated parts of those described with reference to FIGS. 1 to 24 will be briefly described or omitted and it is to be understood that to the extent that details are omitted, these details may be assumed to be at least similar to those of corresponding elements that have already been described elsewhere the present disclosure.

Referring to FIG. 25, in the fabricating equipment of the semiconductor device, according to exemplary embodiments of the present inventive concept, a sacrificial material provider 220 includes a plurality of nozzles.

For example, the sacrificial material provider 220 may include a first nozzle 222 and a second nozzle 224. The sacrificial material provider 220 is shown as including only two nozzles, but the present disclosure is not limited thereto. For example, depending on the sacrificial material being provided, the sacrificial material provider 220 may include three or more nozzles.

According to exemplary embodiments of the present inventive concept, the first nozzle 222 may provide a liquefied first sacrificial material on the wafer W, and the second nozzle 224 may provide a liquefied second sacrificial material on the wafer W.

According to exemplary embodiments of the present inventive concept, the first sacrificial material and the second sacrificial material may include substantially the same material. However, the present disclosure is not limited thereto, and the first nozzle 222 and the second nozzle 224 may also provide the sacrificial materials different from each other.

According to exemplary embodiments of the present inventive concept, the first nozzle 222 may provide the first sacrificial material of first concentration, and the second nozzle 224 may provide the second sacrificial material of a second concentration higher than the first concentration. Also, the second nozzle 224 may provide the second sacrificial material after the first nozzle 222 provides the first sacrificial material.

According to exemplary embodiments of the present inventive concept, the first temperature adjuster 232 may provide a first temperature to the wafer W when the first nozzle 222 provides the first sacrificial material. Also, when the second nozzle 224 provides the second sacrificial material, the first temperature adjuster 232 may provide a second temperature lower than the first temperature to the wafer W.

Figure 26:
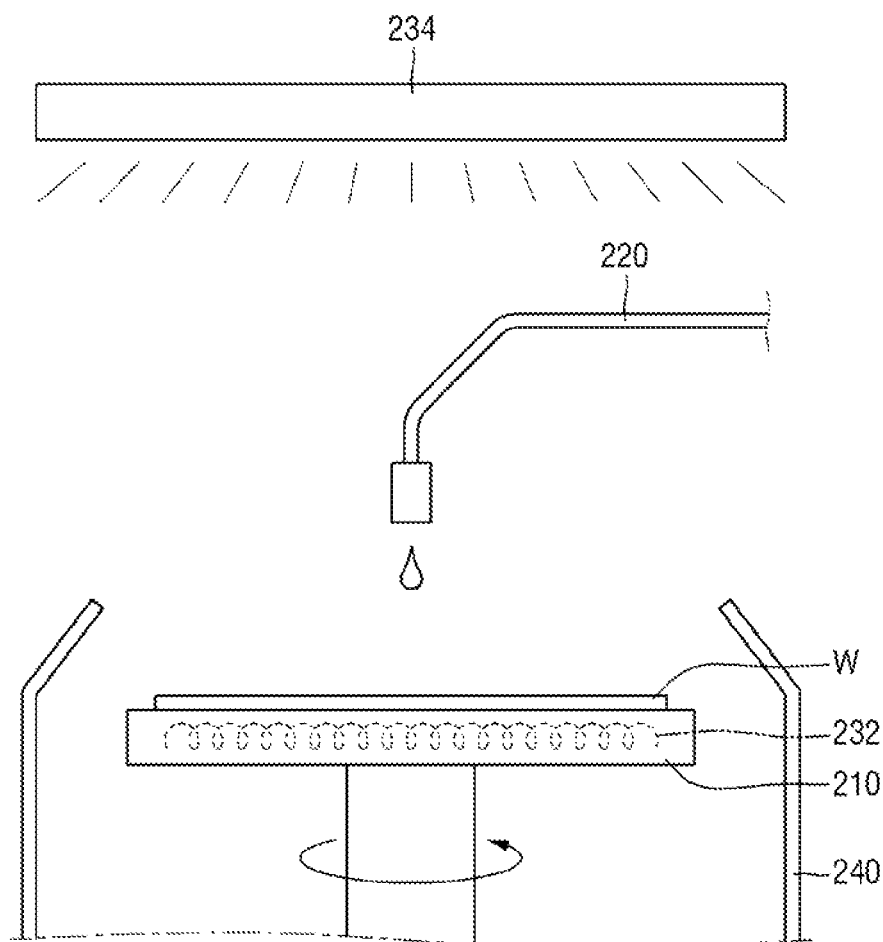
FIG. 26 is a schematic view illustrating fabricating equipment of a semiconductor device, according to exemplary embodiments of the present inventive concept.

FIG. 26 is a schematic view illustrating fabricating equipment of the semiconductor device, according to exemplary embodiments of the present inventive concept. For the sake of convenience of explanation, repeated parts of those described with reference to FIGS. 1 to 24 will be briefly described or omitted and it is to be understood that to the extent that details are omitted, these details may be assumed to be at least similar to those of corresponding elements that have already been described elsewhere the present disclosure.

Referring to FIG. 26, the fabricating equipment of the semiconductor device, according to exemplary embodiments of the present inventive concept, may further include a second temperature adjuster 234.

The second temperature adjuster 234 may include, for example, a flash lamp disposed on the wafer support 210. As a result, the second temperature adjuster 234 may quickly control the temperature of the wafer W.

According to exemplary embodiments of the present inventive concept, the second temperature adjuster 234 may provide the first temperature to the wafer W when the first sacrificial material of first concentration is provided on the wafer W. Further, the second temperature adjuster 234 may provide the second temperature lower than the first temperature to the wafer W, when the second sacrificial material of the second concentration higher than the first concentration is provided on the wafer W. For example, the second temperature adjuster 234 may be turned on when the first sacrificial material is provided, and the second temperature adjuster 234 may be turned off when the second sacrificial material is provided.

Figure 27:
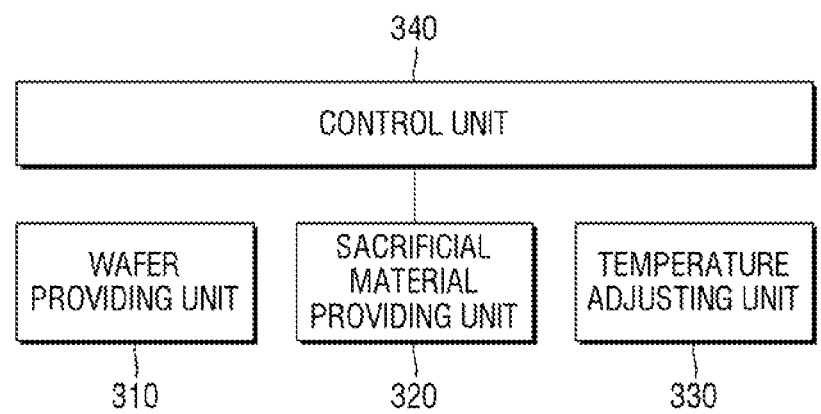
FIG. 27 is a block diagram illustrating fabricating equipment of a semiconductor device, according to exemplary embodiments of the present inventive concept.

FIG. 27 is a block diagram illustrating fabricating equipment of the semiconductor device, according to exemplary embodiments of the present inventive concept. For the sake of convenience of explanation, repeated parts of those described with reference to FIGS. 1 to 26 will be briefly described or omitted and it is to be understood that to the extent that details are omitted, these details may be assumed to be at least similar to those of corresponding elements that have already been described elsewhere the present disclosure.

Referring to FIG. 27, the fabricating equipment of the semiconductor device, according to exemplary embodiments of the present inventive concept, includes a wafer providing unit 310, a sacrificial material providing unit 320 and a temperature adjusting unit 330.

The wafer providing unit 310 may provide the wafer W. According to exemplary embodiments of the present inventive concept, the wafer providing unit 310 may provide the wafer W including the lower structure 110, in which the first sacrificial layer 112 and the first insulating layer 114 are alternately stacked, on the substrate 100. According to exemplary embodiments of the present inventive concept, the lower structure 110 may include a first hole H1 which exposes the upper surface of the substrate 100.

The wafer providing unit 310 may provide the wafer W, for example, in the same way as the wafer support 210 of FIG. 24. The wafer providing unit 310 may form the sacrificial pattern 120 from the sacrificial material provided from the sacrificial material providing unit 320 by rotating the wafer W.

The sacrificial material providing unit 320 may provide the sacrificial material on the wafer W. According to exemplary embodiments of the present inventive concept, the sacrificial material providing unit 320 may provide the sacrificial material that forms the sacrificial pattern 120 inside the first hole H1.

The sacrificial material providing unit 320 may provide the sacrificial material on the wafer W, for example, in the same way as the sacrificial material provider 220 of FIG. 24.

The temperature adjusting unit 330 may adjust the temperature of the wafer W. The temperature adjusting unit 330 may adjust the temperature of the wafer W, for example, in the same manner as the first temperature adjuster 232 of FIG. 24 or the second temperature adjuster 234 of FIG. 26.

According to exemplary embodiments of the present inventive concept, the wafer providing unit 310, the sacrificial material providing unit 320, and/or the temperature adjusting unit 330 may adjust the porosity of the sacrificial pattern 120, so that the porosity of the sacrificial pattern 120 formed in the first hole H1 increases toward the substrate 100.

For example, the wafer providing unit 310 may adjust the rotational speed of the wafer W to adjust the porosity of the formed sacrificial pattern 120. For example, the sacrificial material providing unit 320 may adjust the concentration of the provided sacrificial material to adjust the porosity of the formed sacrificial pattern 120. For example, the temperature adjusting unit 330 may adjust the temperature of the wafer W to adjust the porosity of the formed sacrificial pattern 120.

The fabricating equipment of the semiconductor device, according to exemplary embodiments of the present inventive concept, may further include a control unit 340. The control unit 340 may be connected to the wafer providing unit 310, the sacrificial material providing unit 320, and/or the temperature adjusting unit 330 to control these units. For example, the control unit 340 may control the wafer providing unit 310, the sacrificial material providing unit 320, and/or the temperature adjustment unit 330 to adjust the porosity of the formed sacrificial pattern 120.

The control unit 340 may include, but is not limited to including, for example, a personal computer.

Those skilled in the art will appreciate that many variations and modifications may be made to the exemplary embodiments of the present inventive concept described above without substantially departing from the principles of the present inventive concept.

What is claimed is:

1. A method for fabricating a semiconductor device, comprising:
    forming a lower structure on a substrate, the lower structure including a first sacrificial layer and a first insulating layer alternately and repeatedly stacked;
    forming a first hole in the lower structure, the first hole exposing an upper surface of the substrate;
    forming a sacrificial pattern in the first hole, wherein, a porosity of the sacrificial pattern increases toward the substrate;
    forming an upper structure on the lower structure and the sacrificial pattern, the upper structure including a second sacrificial layer and a second insulating layer alternately and repeatedly stacked;
    forming a second hole in the upper structure, the second hole exposing the sacrificial pattern; and
    removing the sacrificial pattern.

2. The method for fabricating the semiconductor device of claim 1, wherein the forming of the sacrificial pattern comprises:
    providing a sacrificial material on the lower structure; and
    performing a spin coating process, using the sacrificial material.

3. The method for fabricating the semiconductor device of claim 2, wherein the sacrificial material includes cyclopentasilane and/or cyclohexasilane.

4. The method for fabricating the semiconductor device of claim 1, wherein the forming of the sacrificial pattern comprises:
    forming a first material pattern which fills a first part of the first hole and has a first porosity; and
    forming a second material pattern on the first material pattern, the second material pattern filling a second part of the first hole and having a second porosity that is less porous than the first porosity.

5. The method for fabricating the semiconductor device of claim 1, wherein the sacrificial pattern comprises a void in a lower part thereof.

6. The method for fabricating the semiconductor device of claim 1, further comprising:
    forming a semiconductor layer in the first hole and the second hole, after removing the sacrificial pattern.

7. The method for fabricating the semiconductor device of claim 6, further comprising:
    removing the first sacrificial layer and the second sacrificial layer to expose the semiconductor layer;
    forming a charge storage layer on the semiconductor layer; and
    forming a gate pattern on the charge storage layer.

8. The method for, fabricating the semiconductor device of claim 1, wherein the first sacrificial layer and the second sacrificial layer each includes silicon, silicon nitride, silicon oxynitride, and/or silicon carbide.

9. The method for fabricating the semiconductor device of claim 1, wherein the first insulating layer and the second insulating layer each include silicon oxide.

10. The method for fabricating the semiconductor device of claim 1, wherein the sacrificial pattern includes polysilicon.

* * * * *